(12) United States Patent
Battersby

(10) Patent No.: US 6,965,121 B2
(45) Date of Patent: Nov. 15, 2005

(54) TOP GATE THIN-FILM TRANSISTOR AND METHOD OF PRODUCING THE SAME

(75) Inventor: Stephen J. Battersby, Haywards Heath (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 24 days.

(21) Appl. No.: 10/685,248

(22) Filed: Oct. 14, 2003

(65) Prior Publication Data

US 2004/0077133 A1    Apr. 22, 2004

Related U.S. Application Data

(62) Division of application No. 09/716,917, filed on Nov. 20, 2000, now Pat. No. 6,677,191.

(30) Foreign Application Priority Data

Nov. 19, 1999 (GB) .................................. 9927287

(51) Int. Cl.[7] .................. H01L 31/036; H01L 31/0376
(52) U.S. Cl. ........................ 257/57; 257/72; 257/353
(58) Field of Search .......................... 257/57, 66, 72, 257/149, 347, 353, 411

(56) References Cited

U.S. PATENT DOCUMENTS 5,614,729 A * 3/1997 Ukai et al. .................... 257/57
5,981,317 A * 11/1999 French et al. ................ 438/161

* cited by examiner

Primary Examiner—Amir Zarabian
Assistant Examiner—Pamela E Perkins

(57) ABSTRACT

A method of producing a top gate thin-film transistor comprises the steps of forming doped silicon source and drain regions (6a,8a) on an insulating substrate (2) and subjecting the face of the substrate (2) on which the source and drain regions (6a,8a) are formed to plasma treatment to form a doped surface layer. An amorphous silicon layer (12) is formed on the doped surface layer over at least the spacing between the source and drain regions (6a,8a) and an insulated gate structure (14,16) is formed over the amorphous silicon layer (12). Laser annealing of areas of the amorphous silicon layer not shielded by the gate conductor is carried out to form polysilicon portions (12a,12b) having the impurities diffused therein. In the method of the invention, doped silicon source and drain regions underlie the silicon layer to be crystallized using the laser annealing process. It has been found that the laser annealing process can then result in crystallization of the full thickness of the amorphous silicon layer. This results from the similar thermal properties of the doped source and drain regions and the silicon layer defining the main body of the transistor.

9 Claims, 2 Drawing Sheets

TOP GATE THIN-FILM TRANSISTOR AND METHOD OF PRODUCING THE SAME

This is a Divisional of application Ser. No. 09/716,917, filed Nov. 20, 2000 now U.S. Pat. No. 6,677,191.

This invention relates to a top gate amorphous silicon thin-film transistor and a method for producing the same. More particularly, the invention relates to a method in which a self-aligned gate is produced through the use of a laser annealing process. These thin-film transistors are suitable for use in flat panel display devices, for example active-matrix liquid-crystal displays, or in other large-area electronic devices.

Various methods have been proposed for defining self-aligned gate structures in top gate thin-film transistors. In some of these methods, the gate conductor has a width which is smaller than the spacing between the underlying source and drain electrodes. This provides some freedom in the positioning of an insulated gate structure over the silicon body of the transistor. Various processes have been proposed for treating the silicon body of the transistor in those areas between the channel region (beneath the gate) and the source and drain electrodes. This is required to reduce the resistance of the silicon layer in regions other than the channel area of the transistor.

The use of the gate electrode in this process results in a self-aligned structure. One proposed method for reducing this resistance is by doping and laser annealing of the silicon layer on either side of the channel area of the transistor, using the insulated gate structure as a mask to protect the channel area. EP 0691688 discloses a method of manufacturing a top gate thin-film transistor using laser annealing and doping of the silicon layer to reduce the contact resistance to the source and drain electrodes.

The method disclosed in EP 0691688 will be described with reference to FIG. 1.

The transistor is formed on a glass substrate 2. An insulation film 4 overlies the glass substrate to provide a more uniform surface than that of the substrate 2. Metallic source and drain electrodes 6 and 8 are formed over the insulation film 4. These electrodes may be formed of, for example, ITO (indium tin oxide), Molybdenum or a Molybdenum alloy. The source and drain electrode 6, 8 are spaced apart, and the silicon body of the transistor fills this spacing, as will be described below.

The entire face of the substrate is treated with a plasma to diffuse dopant atoms 10 into the surface. These dopant atoms are employed to reduce the resistance of the silicon body of the transistor in regions other than the channel area of the transistor, and also provide a good, low resistance contact between the source and drain electrodes 6 and 8 and the silicon body 12.

An amorphous silicon semi-conductor layer 12 covers the spacing between the source and drain electrode 6, 8 and also partially overlies those electrodes as shown in FIG. 1. Subsequently, a gate insulation film 14 and a gate conductor layer 16 are provided, and the gate conductor layer 16 is patterned to define the gate electrode as shown in FIG. 1.

Subsequent laser irradiation 18 causes the dopant atoms 10 to diffuse into the semi-conductor layer 12. The gate electrode 16 acts as a shield so that this diffusion process is inhibited in the channel area of the transistor. The laser treatment also causes the amorphous silicon 12 to melt, and during subsequent cooling the silicon becomes crystallized to form doped polysilicon source and drain regions 12a, 12b, thereby reducing the resistance between the source and drain electrode 6, 8 and the channel area 12c of the transistor. It is desirable that there is no high-resistance undoped semi-conductor material which is not also covered by the gate 16, since this increases the ON-resistance of the transistor. The laser annealing and doping as described in EP 0691688 therefore reduces the ON-resistance, to improve the response characteristics of the transistor. Furthermore, the use of a gate conductor 16 having a width less than the spacing between the source and drain electrode 6, 8 assists in reducing the parasitic capacitances within the transistor structure, as can be seen from the near-perfect alignment of the edge of the source and drain regions 12a and 12b to the respective edges of the gate 16, due to the shadowing of the laser irradiation by the gate 16.

A problem with the method described above is that the laser annealing of the semi-conductor layer 12, to form polysilicon source and drain regions 12a, 12b, may be unsuccessful in causing crystallization throughout the full depth of the semi-conductor layer 12. In particular, a portion of each of the source and drain regions 12a, 12b overlies the source or drain electrodes 6, 8, whereas another portion overlies the insulating film 4. The different thermal properties of the underlying layers influence the melting and recrystallization process of the silicon. It has been found that the metal source and drain electrodes 6, 8, which have large thermal mass, retard the progression of the melt interface in those regions, when compared to the progression of the melt interface towards the insulating film 4. The thermal energy which flows into the metal of the electrodes 6,8 depends largely on the thermal capacity, for short times such as those used for laser irradiation. The thermal capacity is proportional to the specific heat times the density, and is 2–3 greater for Mo than for Si.

As a result, after the laser annealing process, an amorphous layer of silicon may still remain over the surface of the source and drain electrodes 6, 8 giving increased resistance to the channel 12c and thereby defeating the purpose of the laser crystallization process. One solution to this problem would be to prolong the laser annealing process to ensure that the full thickness of the semi-conductor layer 12 is melted before allowing cooling to take place. However, this may result in damage to the underlying layers for those areas of the silicon layer where the melt interface progresses most rapidly.

It has also been found that the amorphous silicon may peel away from the source and drain electrodes 6, 8 during the laser annealing process. This is particularly found for ITO source and drain electrodes.

According to the invention, there is provided a method of producing a top gate thin-film transistor, comprising the steps of:

forming doped silicon source and drain regions on an insulating substrate;

subjecting the face of the substrate on which the source and drain regions are formed to plasma treatment to form a doped surface layer having impurity atoms diffused therein;

forming an amorphous silicon layer on the doped surface layer over at least the spacing between the source and drain regions;

forming an insulated gate structure over the amorphous silicon layer comprising a gate insulator and an upper gate conductor, the gate conductor being patterned to be narrower than the spacing between the source and drain regions;

laser annealing areas of the amorphous silicon layer not shielded by the gate conductor to form polysilicon portions having the impurities diffused therein.

In the method of the invention, doped silicon source and drain regions underlie the silicon layer to be crystallized using the laser annealing process. It has been found that the laser annealing process can then result in crystallization of the full thickness of the amorphous silicon layer. This results from the similar thermal properties of the doped source and drain regions and the silicon layer defining the main body of the transistor.

The method preferably additionally comprises the step of forming source and drain electrodes with which contact is made by the source and drain regions. The source and drain regions thus provide an intermediate layer between the conventional source and drain electrodes, which are preferably metallic, and the polycrystalline layer which is formed by the laser annealing process. Preferably, the source and drain electrodes are formed on the insulating substrate before the formation of the source and drain regions, the source and drain regions at least partially overlying the source and drain electrodes.

The invention also provides a top gate thin-film transistor comprising:

doped silicon source and drain regions defined from a first silicon layer over an insulating substrate;

a second silicon layer overlying the first silicon layer and extending between the source and drain regions, source and drain portions of the second silicon layer which contact the source and drain regions comprising doped polysilicon and a channel portion of the second silicon layer between the source and drain portions, which is narrower than the spacing between the source and drain regions, comprising substantially undoped amorphous silicon; and an insulated gate structure over the channel portion of the second silicon layer.

The source and drain regions may comprise doped polysilicon.

The invention will now be described by way of example, with reference to and as shown in the accompanying drawings in which.

Figure 1:
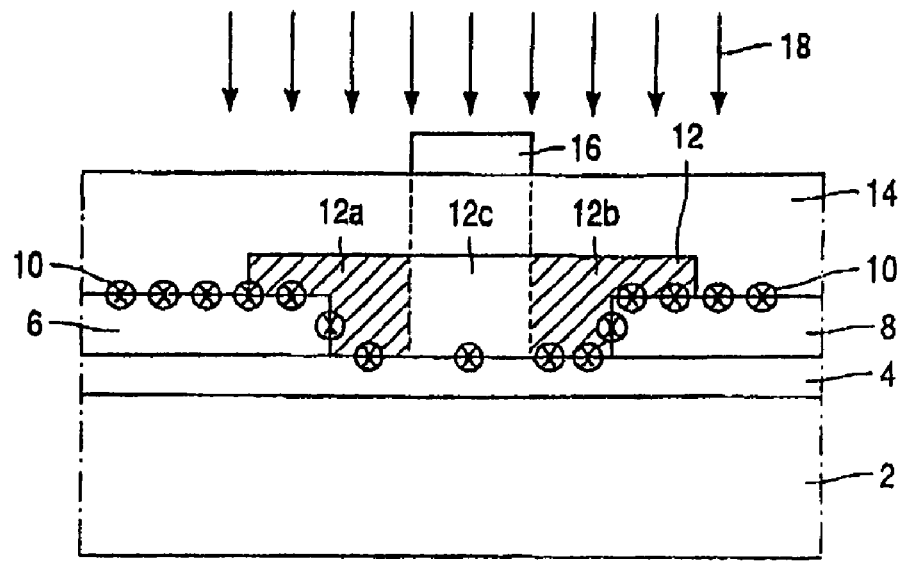
FIG. 1 shows a known thin-film transistor configuration, in which laser annealing is used during the manufacturing process to define polysilicon regions giving a self-aligned gate structure.

The figures are diagrammatic and not drawn to scale. Relative dimensions and proportions of parts of these figures have been shown exaggerated or reduced in size, for the sake of clarity and convenience in the drawings.

Figure 2:
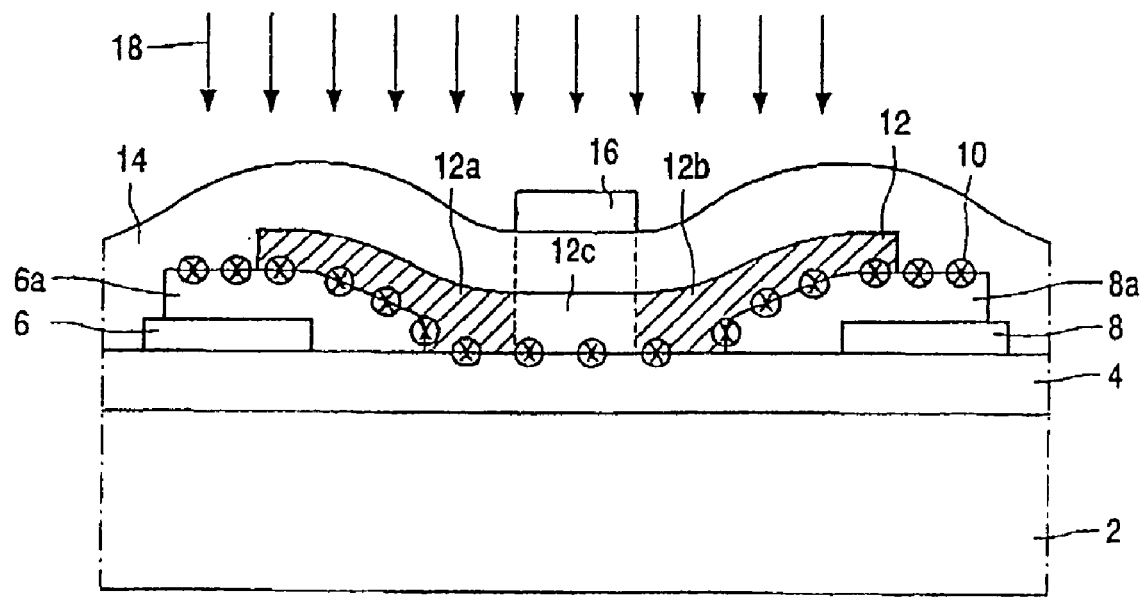
FIG. 2 shows a thin-film transistor of the invention.

The thin-film transistor shown in FIG. 2 comprises an insulating substrate 2 over which an optional insulating film 4 is provided. Source and drain electrodes 6, 8 are defined over the insulating film 4, and doped silicon source and drain regions 6a, 8a are provided at least partially over the source and drain electrodes 6, 8. The surface of these source and drain regions 6a, 8a and the insulating film 4 is subjected to a plasma treatment to form a doped surface layer having impurity atoms 10 diffused therein. An amorphous silicon layer 12 is formed over the doped surface layer over at least the spacing between the source and drain regions 6a, 8a, and at least partially overlying those regions. The source and drain regions 6a, 8a are formed from a first silicon layer, and the silicon layer 12, which defines a channel portion 12c of the transistor, is formed from a second silicon layer. The channel portion 12c is narrower than the spacing between the source and drain regions 6a, 8a, and comprises substantially undoped amorphous silicon. An insulated gate structure 14, 16 is defined over the channel portion 12c.

On either side of the channel portion 12c, the second silicon layer defines source and drain portions 12a, 12b which have been treated using laser irradiation to result in doping by the impurity atoms 10 and to result in crystallization to form polysilicon regions.

The source and drain regions 6a, 8a act as an intermediate layer between the source and drain electrodes 6, 8 and the source and drain portions 12a, 12b of the semi-conductor layer 12 defining the body of the transistor. The source and drain regions 6a, 8a improve the crystallization of the source and drain portions 12a, 12b during the laser annealing process, represented by arrows 18.

In particular, the source and drain regions 6a, 8a have similar thermal properties to the silicon layer 12, so that a melt interface which advances through the silicon layer 12 advances uniformly over the full area of the source and drain portions 12a, 12b during laser annealing. Consequently, at the end of laser annealing the full thickness of the layer 12 has been melted, so that polycrystalline regions are able to form right up to the interface between the source and drain regions 6a, 8a and the source and drain portions 12a, 12b.

The method of manufacturing a thin-film transistor as shown in FIG. 2 will be described in greater detail with reference to FIG. 3.

Figure 3A:
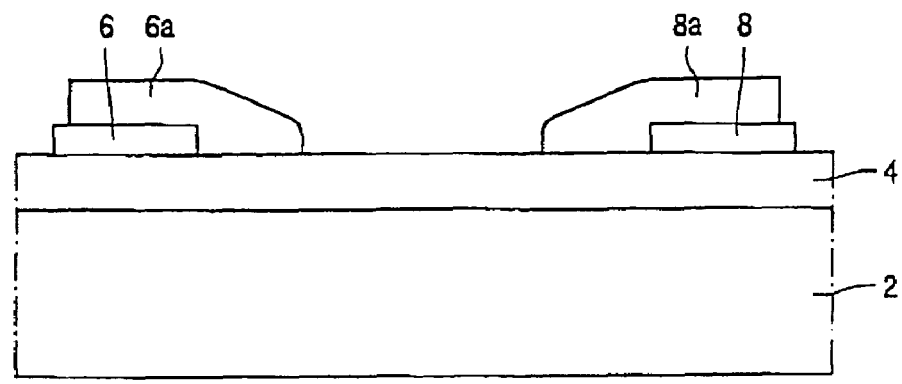
FIG. 3 shows various steps in the manufacture of the thin-film transistor of FIG. 2.

As shown in FIG. 3A, an insulation film 4 such as $SiO_2$ or $SiN_x$ is formed over one side of a glass substrate 2. Source and drain electrodes 6, 8 define a source and drain electrode pattern which may be formed by wet etching of a metallic layer, such as ITO (indium tin oxide), Mo (Molybdenum) or Mo alloy.

In accordance with the method of the invention, doped silicon source and drain regions 6a, 8a are formed which at least partially overlie the source and drain electrodes 6, 8. These regions may comprise doped amorphous silicon or polysilicon, and act as an intermediary between the silicon layer defining the body of the transistor and the source and drain electrodes 6, 8. The source and drain regions 6a, 8a may be defined as a patterned amorphous silicon layer which has been doped by a conventional process. For example, the layer may be produced by a plasma CVD process in an atmosphere giving rise to a doped layer. This atmosphere may comprise silane gas ($SiH_4$) and phosphine gas ($PH_3$) to produce n-type Phosphorus (P) doping. Alternatively, an undoped layer may be deposited and subsequently doped. The layer may also be treated to form polysilicon, for example by a laser or furnace process applied to the structure shown in FIG. 3a. The conversion of amorphous silicon into polysilicon reduces the resistance of those regions.

Figure 3B:
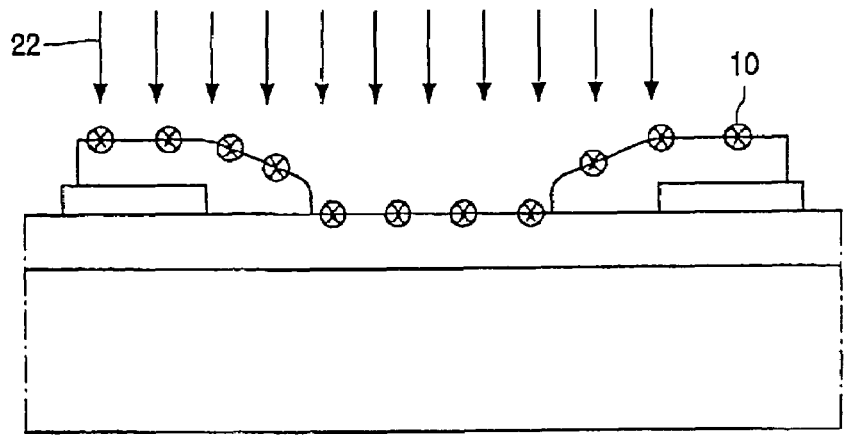

As shown in FIG. 3B the surface of the structure of FIG. 3A is subjected to plasma treatment 22, for example a $PH_3$ plasma, to diffuse P atoms 10 into the surface in order to form a doped surface layer.

Subsequently, a second silicon layer is deposited overlying the first silicon layer, the first layer defining the source and drain regions 6a, 8a. The second silicon layer 12 comprises source and drain portions 12a, 12b which contact the source and drain regions 6a, 8a and a central channel portion 12c. The channel portion 12c is narrower than the spacing between the source and drain regions 6a, 8a so that the alignment of the channel region 12c is not critical to the operation of the transistor. As will be appreciated from the following, the precise positioning of the channel portion 12c is dictated by the positioning of the gate conductor 16, giving rise to a self-aligned structure.

An insulated gate structure is defined over the second silicon layer 12 and comprises a gate insulator, for example silicon nitride 14 and the gate conductor layer 16. The gate conductor layer 16 is patterned to define the gate electrode, and may comprise an aluminium layer. The underlying gate insulator layer 14 may or may not be patterned to correspond to the gate conductor 16.

One advantage of the top-gate transistor structure is that it enables highly conductive aluminium gate electrode patterns to be defined.

Figure 3C:
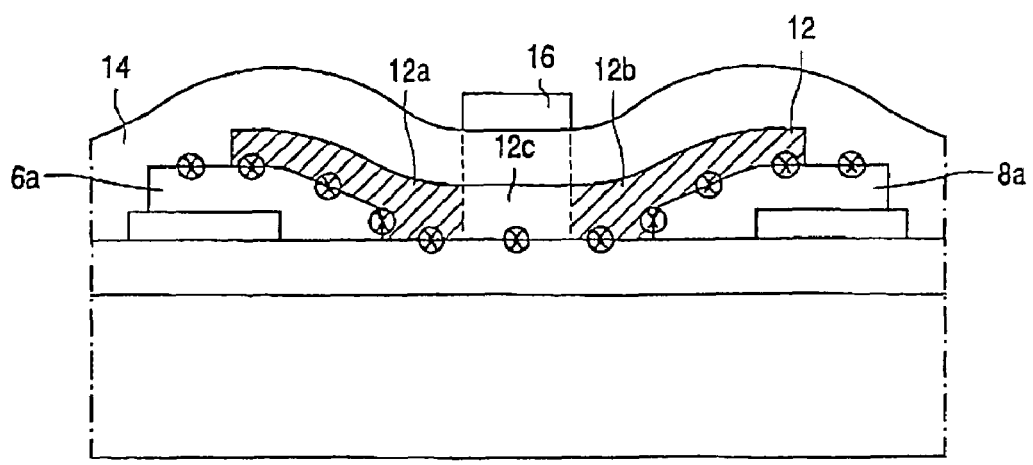

The resulting configuration shown in FIG. 3C is subjected to a laser annealing process, and the gate electrode 16 acts as a mask, so that only the source and drain portions 12a, 12b of the silicon layer 12 are subjected to the laser annealing process, whereas the channel portion 12c remains unaffected.

The laser annealing process causes melting of the silicon layer 12, and a melt interface is defined which progresses through the layer 12 as the annealing process continues. This interface is at the boundary between solid and molten material. Furthermore, the laser treatment causes the impurity phosphorous atoms 10 to diffuse into the surface of the silicon layer 12 causing the desired doping.

The resultant structure thereby comprises doped polysilicon source and drain portions 12a, 12b and a substantially undoped amorphous silicon channel portion 12c.

The laser annealing process comprises radiation using an excimer laser beam radiated normally against the face of the substrate, as represented by arrows 18 in FIG. 2.

It has been found that the similar thermal properties of the source and drain regions 6a, 8a and the silicon layer 12 enable uniform progression of the melt interface through the silicon layer 12 during laser annealing. The laser annealing process can therefore be controlled to ensure that the full thickness of the film has been melted, but without overexposure of any individual region of the silicon layer 12.

The insulating film 4 may be preferred, because it can be used to reduce unevenness in the electrical characteristics of the TFT by smoothing out any irregularities present on the surface of the substrate. However, it may not be required. The plasma treatment has been described as diffusing P (Phosphorus) atoms to produce an n type TFT, but it may equally be possible to produce a p type TFT, for example by $B_2H_6$ plasma treatment to diffuse B (Boron) atoms. In this case the source and drain portions 12a, 12b of the silicon layer 12 will comprise positive doped polysilicon.

The reduced parasitic capacitance and reduced channel to source/drain resistance improves the image qualities of an active-matrix liquid crystal display using thin-film transistors of the invention.

From reading the present disclosure, other modifications will be apparent to persons skilled in the art. Such modifications may involve other features which are already known in the design of thin-film transistors which may be used instead of or in addition to features already described herein.

What is claimed is:

1. A top gate thin-film transistor comprising:

doped silicon source and drain regions defined from a first silicon layer over an insulating substrate;

second silicon layer overlying the first silicon layer and extending between the source and drain regions, source and drain portions of the second silicon layer which contact the source and drain regions comprising doped polysilicon and a channel portion of the second silicon layer between the source and drain portions, which is narrower than the spacing between the source and drain regions, comprising substantially undoped amorphous silicon; and an insulated gate structure over the channel portion of the second silicon layer, wherein the source and drain regions act as an intermediate layer between source and drain electrodes and the source and drain portions of the second silicon layer.

2. A transistor as claimed in claim 1, wherein the source and drain regions comprise doped polysilicon.

3. A transistor as claimed in claim 1 or 2, wherein the source and drain electrodes contact the source and drain regions.

4. A transistor as claimed in claim 3, wherein the source and drain regions overlie the source and drain electrodes.

5. A transistor as claimed in claim 4, wherein the source and drain electrodes comprise ITO or MoCr.

6. A transistor as claimed in claim 3, wherein the source and drain electrodes comprise ITO or MoCr.

7. A transistor as claimed in claim 1 or 2, wherein the source and drain electrodes are metallic.

8. A transistor as claimed in claim 7, wherein the source and drain regions overlie the source and drain electrodes.

9. A transistor as claimed in claim 8, wherein the source and drain electrodes comprise ITO or MoCr.

\* \* \* \* \*